United States Patent [19]
Horioka et al.

[11] Patent Number: 5,320,704
[45] Date of Patent: Jun. 14, 1994

[54] PLASMA ETCHING APPARATUS

[75] Inventors: Keiji Horioka, Kawasaki; Yukimasa Yoshida, Yokohama; Shiro Koyama, Fuchu, all of Japan

[73] Assignee: Tokyo Electron Limited, Tokyo, Japan

[21] Appl. No.: 798,970

[22] Filed: Nov. 27, 1991

[30] Foreign Application Priority Data

Nov. 28, 1990 [JP] Japan ................... 2-331318

[51] Int. Cl.⁵ .......................................... H01L 21/00
[52] U.S. Cl. ............................. 156/626; 156/643; 156/345; 156/627; 204/298.32; 204/192.30
[58] Field of Search ............... 156/626, 627, 345, 643; 118/723; 204/192.33, 192.31, 298.03, 298.32

[56] References Cited

U.S. PATENT DOCUMENTS

| | | | |
|---|---|---|---|
| 4,289,188 | 9/1981 | Mizutani et al. | 156/626 |
| 4,491,499 | 1/1985 | Jerde et al. | 156/626 |
| 4,569,592 | 2/1986 | Osada | 156/626 |
| 4,906,347 | 3/1990 | Tomita et al. | 156/643 |
| 5,045,149 | 9/1991 | Nulty | 156/627 |
| 5,097,430 | 3/1992 | Birang | 156/643 |
| 5,208,644 | 5/1993 | Litvak et al. | 204/192.32 |

FOREIGN PATENT DOCUMENTS

| | | |
|---|---|---|
| 57-12529 | 3/1982 | Japan . |
| 59-025227 | 2/1984 | Japan . |
| 61-206226 | 9/1986 | Japan . |
| 03149814 | 6/1991 | Japan . |
| 91149815 | 6/1991 | Japan . |

*Primary Examiner*—Brian E. Hearn
*Assistant Examiner*—George Goudreau
*Attorney, Agent, or Firm*—Oblon, Spivak, McClelland, Maier & Neustadt

[57] ABSTRACT

A magnetron plasma etching apparatus comprises a chamber and a mount for supporting a substrate. A high-potential electrode connected to an RF power source is connected to the mount, and a low-potential electrode which is grounded is connected to the chamber. A rotary magnet is provided above the chamber, thereby generating a rotary magnetic field intersecting at right angles an electric field generated by both electrodes. An end-point detecting member for detecting an end-point of etching of the substrate is provided at the side of the chamber. The end-point detecting member collects mainly the light at a region near the rotation center of the magnetic field. That light component of a spectrum, which varies greatly with the progress of the etching, is extracted from the collected light, and the intensity of the light of this spectrum is converted to a first electric signal. The intensity of the collected light is converted to a second electric signal. The end-point detecting means calculates a ratio of the first and second electric signals, and the end-point of the etching is detected on the basis of the ratio.

19 Claims, 5 Drawing Sheets

PLASMA ETCHING APPARATUS

BACKGROUND OF THE INVENTION

1. Field of the Invention

The present invention relates generally to a plasma etching apparatus and, more particularly, to a plasma etching apparatus employed in a semiconductor device manufacturing system.

2. Description of the Related Art

A magnetron plasma etching apparatus is employed in a semiconductor device manufacturing system. In the magnetron plasma etching apparatus, a magnetic field is generated so as to intersect an electric field at right angles which is generated between parallel electrodes, thereby attaining a higher etching rate (about 1 $\mu$/min) at a lower pressure (about $10^{-3}$ torr). In addition, in the magnetron plasma etching apparatus, a magnet serving as means for generating a magnetic field is rotated, thereby making the magnetic field uniform and enhancing etching characteristics.

Figure 6:
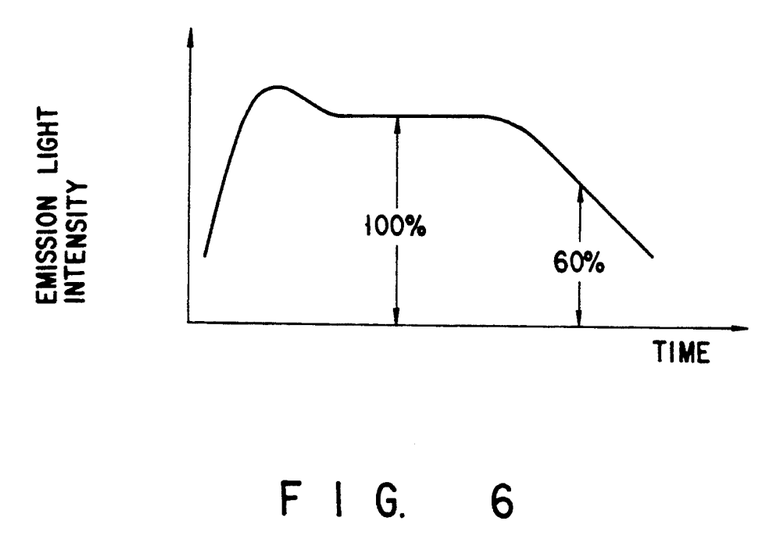
FIG. 6 shows schematically a variance in intra-chamber emission light intensity with the passing of time.

In this type of apparatus, it is an indispensable condition to exactly detect an etching end-point, for the subsequent processing. For this purpose, a transparent window is formed in a plasma-producing process chamber, and an etching end-point detector (EPD) is situated so as to face the window. The EPD detects the intensity of all light emitted from the intra-chamber atmosphere by a plasma ("intra-chamber emission light), and, as shown in, for example, FIG. 6, an etching end-point is determined when the emission light intensity has decreased to 60% (100% in the normal etching state).

In this etching end-point detector, however, the etching end-point is detected on the basis of the degree of variance in intra-chamber emission light intensity, as has been stated above. Thus, when a wafer of a low aperture rate, which has a narrow etching area, is treated, it is difficult to exactly detect the etching end-point. That is, when the aperture rate in etching is low, the degree of variance in intra-chamber emission light intensity is low. The aperture rate decreases in accordance with the advancement of semiconductor device integration.

Further, when the magnet is rotated to rotate the magnetic field, as stated above, the region of a high plasma density moves and consequently the intra-chamber emission light intensity detected by the EPD varies. It is therefore more difficult to detect the variance in intra-chamber emission light intensity in the case of carrying out the low-aperture-rate etching. It is substantially impossible to detect the etching end-point.

This drawback is conspicuous when the aperture rate of a wafer is 5% or less. In these years, a still lower aperture rate is required in accordance with higher integration of semiconductor devices. For example, in the manufacture of a 16 M-Byte semiconductor memory, it is required that the etching end-point be exactly detected under a condition of 3% or lower aperture rate.

SUMMARY OF THE INVENTION

The object of the present invention is to provide a plasma etching apparatus capable of exactly controlling an etching end-point, even when a low-aperture-rate wafer is plasma-etched.

According to a first aspect of the invention, there is provided a plasma etching apparatus for etching a substrate by using a plasma, comprising:

a chamber for containing a substrate;

means for supplying an etchant to the substrate;

plasma producing means for producing a plasma of the etchant;

light collecting means for collecting light emitted from the inside atmosphere of the chamber while etching the substrate;

a spectroscope for extracting that light component of a spectrum from the collected light, which varies greatly with the progress of the etching;

a first photo-sensor for converting the intensity of light of said spectrum into a first electric signal;

a second photo-sensor for converting the intensity of the collected light into a second electric signal; and end-point detecting means for detecting an end-point of the etching on the basis of the first and second electric signals.

According to a second aspect of the invention, the plasma producing means includes electric field generating means for generating an electric field within the chamber, magnetic field generating means for generating a magnetic field intersecting the electric field at right angles, and rotating means for rotating the magnetic field in a plane intersecting the electric field at right angles. In this case, the light collecting means is constructed to mainly collect the light at a region near the rotation center of the magnetic field.

According to the present invention, the etching end-point is determined on the basis of both the collected light containing various spectra and the light of the spectrum whose intensity varies greatly with the progress of etching. For example, a light intensity variance due to an external factor such as rotation of magnetic field appears in both first and second electric signals; therefore, erroneous determination due to this variance can be prevented.

When the etching approaches an end-point, the first electric signal varies more greatly than the second electric signal; thus, the etching end-point can be determined on the basis of a difference between both signals. In particular, in the case of a low-aperture-rate plasma treatment, an end-point which could not be detected on the basis of only the second electric signal, can exactly be detected.

In the case of generating a rotary magnetic field, the light collecting means is constructed to mainly collect the light at a region near the rotation center of the magnetic field. This construction has been devised, paying attention to the fact that the variance in intra-chamber emission light intensity due to rotation of magnetic field is very low in the vicinity of the rotation center of the magnetic field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 5:
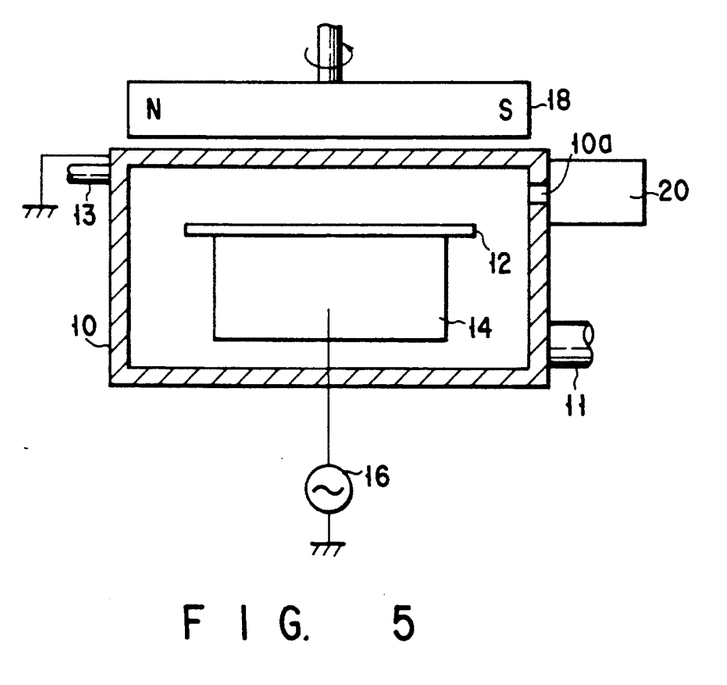
FIG. 5 is a schematic cross-sectional view of a magnetron plasma etching apparatus according to a first embodiment of the present invention.

FIG. 5 shows a magnetron plasma etching apparatus according to a first embodiment of the invention. A mount 14 for supporting a wafer 12 is provided within a plasma chamber 10. Air can be evacuated from the plasma chamber 10 through a pipe 11 connected to a lower part of a side wall of the chamber 10, thereby creating a vacuum in the chamber 10. An etching gas is introduced into the chamber 10 through a pipe 13 connected to an upper part of a side wall of the chamber 10 and is discharged through the pipe 11. The mount 14 is connected to an RF power source 16 capable of generating a high-frequency power of, e.g. 400 KHz or 13.56 MHz, and thus the mount 14 functions as a high-potential electrode. On the other hand, the plasma chamber 10 is grounded and functions as a low-potential electrode. Both electrodes constitute card-coupling type RIE (reactive-ion etching) parallel plate electrodes, which sandwich the wafer. When the RF power source 16 is turned on, a plasma is produced on the wafer 12 between the parallel electrodes.

According to this embodiment, a magnet 18 for producing a horizontal magnetic field intersecting at right angles with an electric field near the wafer 12 is also provided above the plasma chamber 10, thus carrying out uniform etching with high anisotropy. The magnet 18 is rotatable, as is shown in FIG. 5, so that it can produce a uniform horizontal magnetic field over the whole wafer 12.

The chamber 10 is provided with a window 10a for detecting an etching end-point in the plasma chamber 10. An etching end-point detector (EPD) 20 is situated to face the window 10a.

Figure 1:
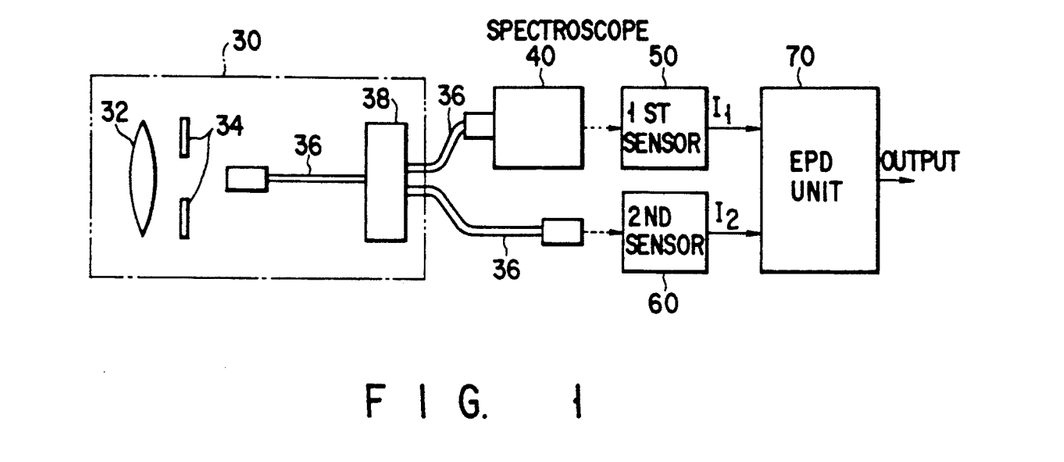
FIG. 1 is a block diagram of an etching end-point detector according to the present invention.

As is shown in FIG. 1, the EPD 20 comprises an optical system 30, a spectroscope 40, a first sensor 50, a second sensor 60, and an end-point detection unit 70.

The optical system 30 comprises a lens 32, which faces the window 10a of the plasma chamber 10 shown in FIG. 5, a stop 34 and an optical fiber 36. The focal point of the lens 32 is adjusted to coincide substantially with a rotational center line of a magnetic field caused in the chamber 10 by the rotation of the magnet 18.

When the magnet 18 is rotated, a horizontal uniform magnetic field is produced on the wafer 12. Thereby, an intra-chamber plasma emission light intensity distribution rotates in synchronism with the rotation of the magnet 18. Under the situation, according to this embodiment, the optical system 30 is constituted so as to collect light at a region near a rotation center where a light emission variance is minimal. Light propagated through the optical fiber 36 is guided into two light passages, for example, by means of a distributor 38. One part of the light, traveling through one light passage is guided to a spectroscope 40, and the other part of the light, traveling through the other light passage, reaches a second photo-sensor 60. The distributor 38 functions only to divide the optical fiber 36. If two fibers are employed initially, the distributor 38 may be omitted.

The spectroscope 40 functions to extract a light component of a specific wavelength or spectrum from the one part of the light, which has been guided through the optical fiber 36. It is desirable to extract a light component of a spectrum which varies largely in accordance with the progress of etching. For example, when a Si substrate is etched by $CHF_3$ with an $SiO_2$ film employed as a mask, it is desirable to extract a light component (spectrum) with a wavelength of 483.5 nm due to a CO glow. The extracted spectrum of 483.5 nm wavelength is input to a first photo-sensor 50 and converted to an electric signal. On the other hand, collected light having various wavelength spectra is directly input to the second sensor 60, and an electric signal corresponding to the emission light intensity is output.

The end-point detection unit 70 receives an electric signal $I_1$ from the first photo-sensor (e.g. a photoelectric converter) and an electric signal $I_2$ from the second photo-sensor 60 (e.g. a photoelectric converter), and detects an etching end-point. In this embodiment, the end-point detection unit 70 carries out the etching end-point detection on the basis of a variance in the relative value of the first and second photo-sensor output signals.

Figure 2:
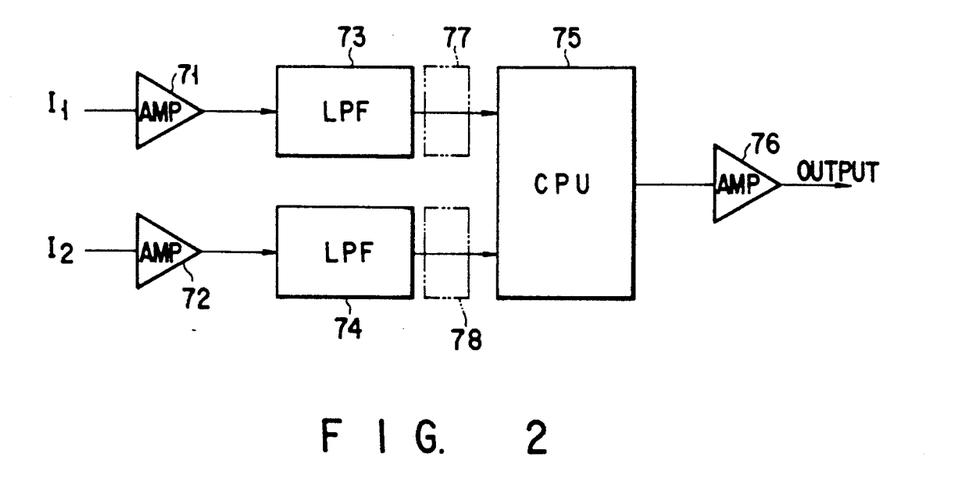
FIG. 2 is a block diagram of an end-point detection unit of the etching end-point detector of FIG. 1.

The end-point detection unit 70 will now be described with reference to FIG. 2. The output signal $I_1$ from the first photo-sensor is amplified by an amplifier 71. A high-frequency component of the output from the amplifier 71 is removed by a low-pass filter 73, and the resultant signal is fed to a CPU 75. Similarly, the output signal $I_2$ from the second photo-sensor is amplified by an amplifier 72, a high-frequency component of the output from the amplifier 72 is removed by a low-pass filter 74, and the resultant signal is fed to the CPU 75.

Figure 3A:
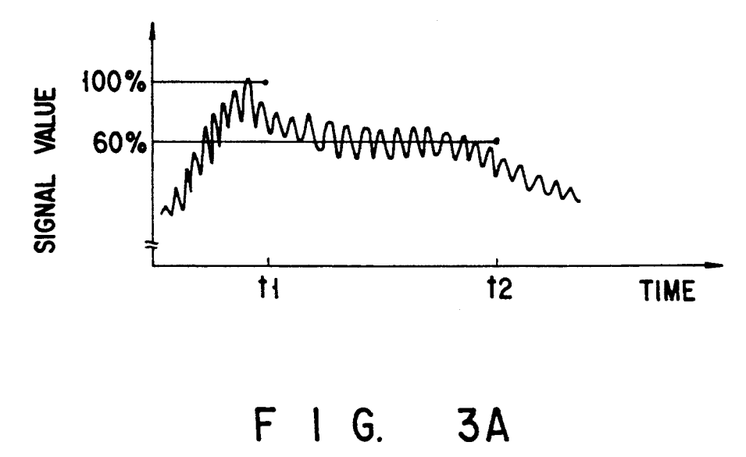
FIG. 3A is a graph showing an example of a variance of an output signal from a first photo-sensor with the passing of time.

FIG. 3A shows an example of a variance of the output signal $I_1$ of the first photosensor 50 with the passing of time, in the case where the aperture rate of wafer 12 is 5%. According to the EPD 20 of this embodiment, only the light component of 483.5 nm wavelength is extracted from the spectroscope 40 and is detected by the first sensor 50. Thus, even if the aperture rate of the wafer 12 is low, the variance of the signal value in accordance with the progress of etching is large, and this technique is very effective in exactly detecting the etching end-point. In addition, according to this embodiment, the output signal $I_2$ of the second photosensor 60 is employed to enhance the precision of etching endpoint detection.

As has been stated above, in the prior art, the etching end-point is determined by checking whether the intra-chamber emission light intensity has lowered to a predetermined value with the progress of etching (in this embodiment, 60% of the intra-chamber emission light intensity in the normal etching state). However, the time-based variance of the intra-chamber emission light intensity detected by photo-sensors is a composite of a variance due to etching progress and a periodical variance due to rotation of the magnetic field. When the variance due to rotation of magnetic field is large, the intra-chamber emission light intensity may temporarily decrease to 60% of the intra-chamber emission light intensity in the normal etching state; consequently, the etching end-point may be erroneously detected.

Figure 3B:
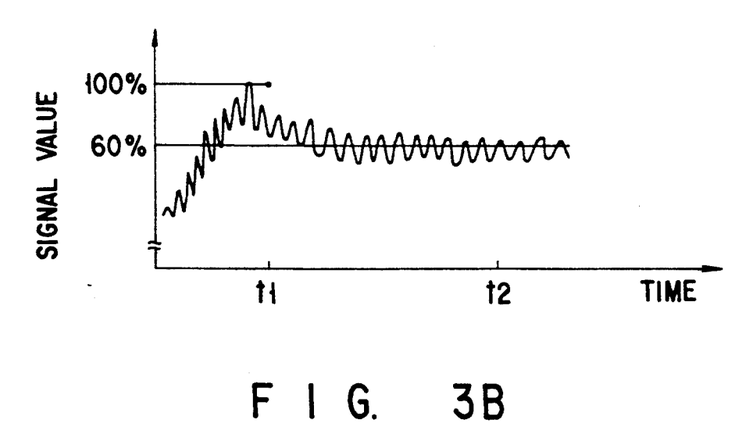
FIG. 3B is a graph showing an example of a variance of an output signal from a second photo-sensor with the passing of time.

FIG. 3B shows an example of a variance of the output signal $I_2$ of the second photosensor with the passing of time, in the case where the aperture rate of wafer 12 is 5%. As is shown in FIG. 3B, a variance of the output signal 12 of the second photo-sensor due to etching progress is very small. In particular, when the aperture rate of the wafer is low, the variance is substantially zero.

A relationship, $(\Delta I_1/I_1)=(\Delta I_2/I_2)$, is approximately established between a variance $\Delta I_1$ of output signal $I_1$ of the first photo-sensor due to rotation of the magnetic field and a variance $\Delta I_2$ of output signal $I_2$ of the second photo-sensor due to rotation of the magnetic field. Thus, by using the output signal $I_2$, the influence of the variation $\Delta I_1$ due to rotation of the magnetic field can be removed.

There are various methods of eliminating the influence of variance $\Delta I_1$ by use of output signal $I_2$. In this embodiment, each time the CPU 75 receives an output signal $I_1$ and output signal $I_2$, the ratio $(I_1/I_2)$ of output signal $I_1$ to output signal $I_2$ is calculated, and the result of calculation is output via the amplifier 76. Specifically, in the normal etching state, the ratio $I_1/I_2$ is substantially constant; however, when the etching process progresses nearly to an etching end-point, the value of the output signal $I_1$ decreases while the value of the output signal $I_2$ is substantially unchanged. As a result, the ratio $I_1/I_2$ decreases. The result of this calculation is input to a determining circuit (not shown) constituted by, e.g. a microcomputer, and the etching end-point can be determined by examining whether the input value has become lower than a predetermined threshold level.

As has been stated above, when the time-based variance of the ratio of output signal $I_1$ of the first photo-sensor 50 to output signal $I_2$ of the second photo-sensor 60 is taken into account, the detection error of the etching end-point is very small.

Figure 4:
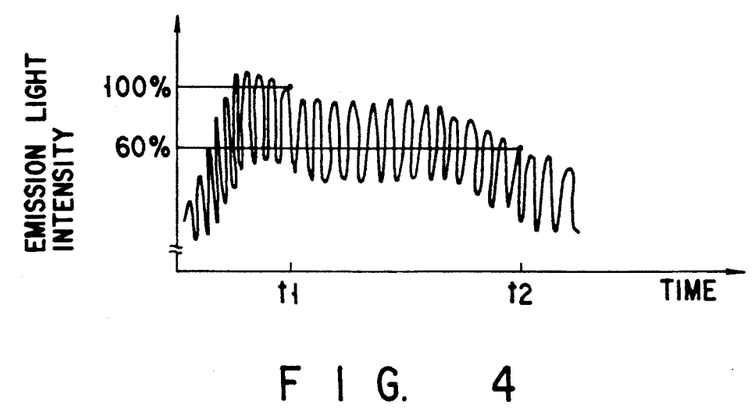
FIG. 4 is a graph showing an example of a variance of an output signal from a photo-sensor with the passing of time, in the case where an intra-chamber emission light intensity is detected directly by means of a photo-sensor without using an optical system.

Further, according to this embodiment, in order to enhance the detection precision of the etching end-point, the optical system 30 collects only the light at the region near the rotation center of the magnetic field produced within the chamber 10 by the rotation of the magnet 18. For the purpose of comparison, FIG. 4 shows a time-based variance of an output of the photosensor 50 when the intra-chamber emission light intensity i detected directly by the photo-sensor 50 without using the optical system 30. As can be seen from comparison between FIG. 3A and FIG. 4, by collecting the light in a region, where the magnetic field is not greatly varied, by using the optical system 30, the variance of output signal due to rotation of the magnetic field can be reduced, and the determination of the etching end-point is facilitated.

Figure 7:
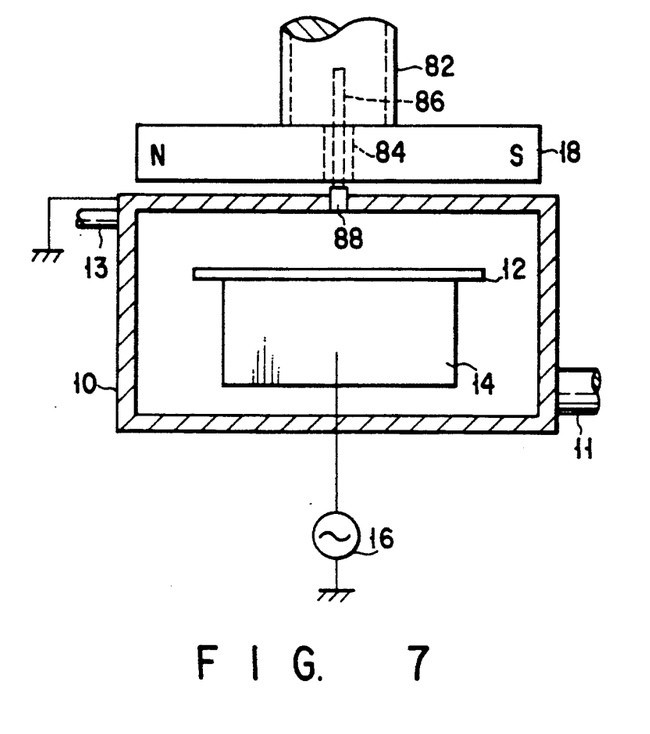
FIG. 7 is a schematic cross-sectional view of a magnetron plasma etching apparatus according to a second embodiment of the invention.
Figure 8:
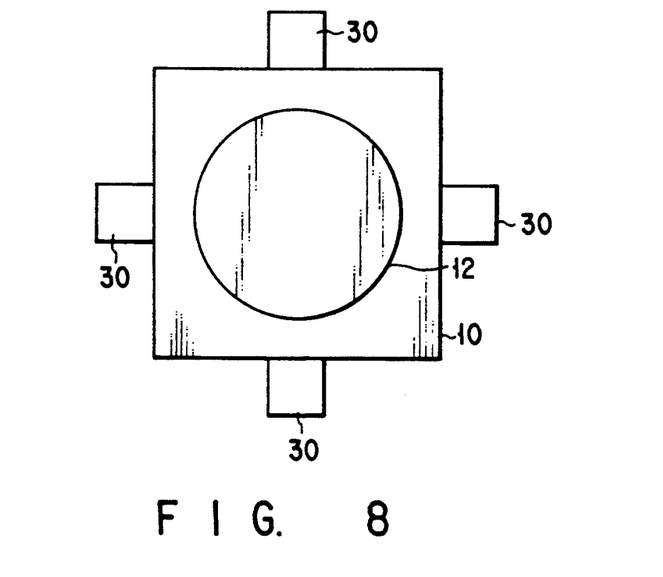
FIG. 8 is a schematic cross-sectional view of a magnetron plasma etching apparatus according to a third embodiment of the invention.

FIGS. 7 and 8 show magnetron plasma etching apparatuses according to second and third embodiments of the invention.

In the second embodiment of FIG. 7, intra-chamber emission light is collected at an upper center of the chamber 10, and not at the side of the chamber 10. In this embodiment, as shown in FIG. 7, a rotary shaft 82 of a magnet 18 is hollow and a light-collection fiber 86 passes through the shaft 82. The fiber 86 penetrates a hole 84 in the magnet 18 and is connected to a terminal 88 at the upper part of the chamber 10. The terminal 88 is situated so as to be aligned with the rotation center of the magnet 18. The terminal 88 is made of a light-transmissive and electrically conductive material. According to this embodiment, the light at the region corresponding to the rotation center of the magnet 18 can be collected more exactly than in the first embodiment. Thus, the variance of output signal due to rotation of the magnetic field can remarkably reduced.

In the third embodiment of FIG. 8, the light in the chamber is collected at four sides of the chamber 10, and not at one side thereof. In the third embodiment, as shown in FIG. 8, four optical systems 30 are arranged at four points on the four sides of the chamber 10 at right angles. An optical fiber of each optical system is divided into two lines, as shown in FIG. 1, one line being connected to the first photo-sensor 50 and the other being connected to the second photo-sensor 60. According to this embodiment, the ratio $(I_1/I_2)$ of output signals is equal to an average value of light intensities detected by the four optical systems. Thus, compared to the first embodiment, the variance of output signals due to the rotation of magnetic field can remarkably be reduced.

The aforementioned ratio $I_1/I_2$ may be replaced by a ratio $(MI_1/MI_2)$ of value $MI_1$ to value $MI_2$ which are obtained by averaging output signals $I_1$ and $I_2$ with respect to one rotation of the magnet. The values $MI_1$ and $MI_2$, like $I_1$ and $I_2$, can be obtained as analog signals. Thus, the ratios $MI_1/MI_2$ can be obtained as analog values. In order to obtain $MI_1$ and $MI_2$, smoothing sections 77 and 78 are provided on the respective lines prior to the CPU 75. The details of the smoothing sections 77 and 78 are described in U.S. patent application Ser. No. 07/732,912 (filed Jul. 19, 1991 by YOKOTA et al.), the teachings of which are hereby incorporated by reference.

According to the method employing $MI_1$ and $MI_2$, the influence of a variance of each signal due to rotation of magnetic field can be reduced. Thus, the etching end-point can be determined more exactly. This method can be combined with any on of the first to third embodiments shown in FIGS. 5, 7 and 8.

The present invention is not limited to the above embodiments, and various changes and modifications can be made without departing from the spirit of the present invention. The means for rotating the magnetic field is not limited to the means for mechanically rotating the magnet 18; it is possible to form magnetic field generating means of a coil and rotate the magnetic force lines by turning on/off the supply of power to the coil. In addition, although the above embodiments were applied to the monitoring of low-aperture-rate etching, this invention is, of course, applicable to high-aperture-rate etching.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetron plasma etching apparatus for etching a substrate by using a plasma, comprising:
   a chamber for containing a substrate;
   means for supplying an etchant to the substrate;
   plasma producing means for producing a plasma of the etchant, said plasma producing means including electric field generating means for generating an electric field within the chamber, magnetic field generating means for generating a magnetic field intersecting the electric field at right angles, and rotating means for rotating the magnetic field in a plane intersecting the electric field at right angles;
   light collecting means for collecting light emitted from the inside atmosphere of the chamber while etching the substrate, said light collecting means being constructed to mainly collect light at a region near the rotation center of the magnetic field;
   means for dividing the collected light into first and second parts;
   a spectroscope for extracting that light component of a spectrum from said first part of the collected light, which varies greatly with the progress of the etching;
   a first photo-sensor for converting the intensity of light of said spectrum into a first electric signal;
   a second photo-sensor for converting the intensity of said second part of the collected light into a second electric signal, which represents background noise; and
   end-point detecting means for detecting an end-point of the etching on the basis of a variation in the relative values of the first and second electric signals.

2. The apparatus according to claim 1, wherein said electric field generating means includes a high-potential electrode connected to an RF power source and a low-potential electrode facing the high-potential electrode.

3. The apparatus according to claim 1, wherein a mount for supporting the substrate is provided within the chamber, said high-potential electrode is provided on the mount, said low-potential electrode is provided on the chamber, and both electrodes constitute a parallel plate electrode structure which is parallel to the major surface of the substrate.

4. The apparatus according to claim 1, wherein said end-point detecting means includes means for calculating a ratio of said first and second electric signals, and the end-point of the etching is detected on the basis of the ratio.

5. A magnetron plasma etching apparatus for etching a substrate by using a plasma, comprising:
   a chamber for containing a substrate;
   means for supplying an etchant to the chamber;
   means for exhausting the chamber;
   a mount for supporting the substrate in the chamber, and constituting an electrode;
   an RF power source connected to the mount;
   a counter electrode arranged opposite to the mount and constituting part of the chamber, an electric field being generated between the mount and counter electrode and in the chamber;
   a magnetic arranged outside the chamber and behind the counter electrode, and generating a magnetic field intersecting the electric field at right angles;
   rotating means for rotating the magnetic field in a plane intersecting the electric field at right angles;
   light collecting means for collecting light emitted from the inside atmosphere of the chamber while etching the substrate, said light collecting means being constructed to mainly collect light at a region near the rotation center of the magnetic field;
   means for dividing the collected light into first and second parts;
   a spectroscope for extracting that light component of a spectrum from said first part of the collected light, which varies greatly with the progress of the etching;
   a first photo-sensor for converting the intensity of light of said spectrum into a first electric signal;
   a second photo-sensor for converting the intensity of said second part of the collected light into a second electric signal, which represents background noise; and
   end-point detecting means for detecting an end-point of the etching on the basis of a variation in the relative values of the first and second electric signals.

6. The apparatus according to claim 1, wherein said light collecting means includes an optical system having a light collecting lens, and the focal point of the lens is adjusted to coincide substantially with the rotation center line of the magnetic field.

7. The apparatus according to claim 1 wherein said light collecting means has a light collecting terminal disposed on the chamber on the rotation center line of the magnetic field.

8. The apparatus according to claim 6, wherein a plurality of said optical systems are arranged equidistantly in the rotational direction of the magnetic field.

9. The apparatus according to claim 4, wherein said end-point detecting means further includes smoothing means for converting said first and second electric signals to third and fourth electric signals obtained by averaging the first and second electric signals with respect to one rotation of the magnetic field, and said end-point detecting means detects the end-point of the etching on the basis of a variation in the relative values of the third and fourth signals.

10. The apparatus according to claim 9, wherein said end-point detecting means includes means for calculating a ratio of the third and fourth electric signals, and the end-point of the etching is detected on the basis of the ratio.

11. A plasma etching apparatus for etching a substrate by using a plasma, comprising:
   a chamber for containing a substrate;
   means for supplying an etchant to the substrate;
   plasma producing means for producing a plasma of the etchant,
   light collecting means for collecting light emitted from the inside atmosphere of the chamber while etching the substrate;
   means for dividing the collected light into first and second parts;
   a spectroscope for extracting that light component of a spectrum from said first part of the collected light, which varies greatly with the progress of the etching;

a first photo-sensor for converting the intensity of light of said spectrum into a first electric signal;

a second photo-sensor for converting the intensity of said second part of the collected light into a second electric signal, which represents background noise; and end-point detecting means for detecting an end-point of the etching on the basis of a variation in the relative values of the first and second electric signals, wherein said end-point detecting means includes means for calculating a ratio of the first and second electric signals, and the end-point of the etching is detected on the basis of said ratio.

12. The apparatus according to claim 5, wherein the light collecting means includes an optical system having a light collecting lens, and the focal point of the lens is adjusted to coincide substantially with the rotation center line of the magnetic field.

13. The apparatus according to claim 11, wherein said plasma producing means includes an electric field generating means for generating an electric field within the chamber.

14. The apparatus according to claim 13, wherein said plasma producing means includes magnetic field generating means for generating a magnetic field intersecting the electric field at right angles, and rotating means for rotating said magnetic field in a plane intersecting said electric field at right angles.

15. The apparatus according to claim 14, wherein the light collecting means is constructed to mainly collect light at a region near the rotation center of the magnetic field.

16. The apparatus according to claim 14, wherein said end-point detecting means further includes smoothing means for converting said first and second electric signals to third and fourth electric signals obtained by averaging the first and second electric signals with respect to one rotation of the magnetic field, and said end-point detecting means detects the end-point of the etching on the basis of a variation in the relative values of the third and fourth signals.

17. The apparatus according to claim 16, wherein said end-point detecting means includes means for calculating a ratio of the third and fourth electric signals, and the end-point of the etching is detected on the basis of the ratio.

18. The apparatus according to claim 12, wherein the lens is arranged at a side of the chamber.

19. The apparatus according to claim 5, wherein light collecting means has a light collecting terminal disposed on the chamber on the rotation center line of the magnetic field.

* * * * *